United States Patent
Lawley et al.

[11] Patent Number: 5,970,326
[45] Date of Patent: Oct. 19, 1999

[54] THIN FILM TRANSISTOR FILMS MADE WITH ANODIZED FILM AND REVERSE-ANODIZED ETCHING TECHNIQUE

[75] Inventors: Christopher A. Lawley, Plymouth; James E. Curran, Haywards Heath, both of United Kingdom

[73] Assignee: U.S. Philips Corporation, New York, N.Y.

[21] Appl. No.: 08/861,346

[22] Filed: May 21, 1997

[30] Foreign Application Priority Data

May 24, 1996 [GB] United Kingdom .................. 9610878

[51] Int. Cl.$^6$ ............................ H01L 21/00; H01L 21/84
[52] U.S. Cl. ......................... 438/158; 438/460; 438/694
[58] Field of Search ............................. 438/30, 158, 460

[56] References Cited

U.S. PATENT DOCUMENTS

| | | | |
|---|---|---|---|
| 5,130,829 | 7/1992 | Shannon | 359/59 |
| 5,202,274 | 4/1993 | Bae et al. | 437/40 |
| 5,545,571 | 8/1996 | Yamazaki et al. | |

*Primary Examiner*—Richard Booth
*Assistant Examiner*—Jonathan Hack
*Attorney, Agent, or Firm*—John C. Fox

[57] ABSTRACT

Anodising treatments are used to form insulating films (12) in the manufacture of a flat-panel display or other large-area thin-film electronic device. A first film (1,101) of anodisable material (e.g Al) is anodised through a part of its thickness to form an anodic second film (2). A mask pattern (4), e.g of photoresist, is provided at least on the second film (2) to define an area (5) where the second film (2) is etched away through at least a part of its thickness and where a further anodising step is carried out to form an anodic third film (3) contiguous with a remaining part of the anodic second film (2). The manufacture is simplified by using reverse-anodising in an electrolyte solution (20) to carry out the etching of the second film (2). The first film (1,101) is biased negatively as a cathode to carry out the reverse-anodising, after which the further anodising step is carried out by biasing the first film (1,101) positively as an anode in the same electrolyte solution (20) to form the anodic third film (3). A remaining part (11a, 11b) of the first film (1) may provide a conductor track or gate electrode over which there is an insulating film (12) comprising a part of the anodic second film (2) on top of the track/electrode (11a, 11b) and a part of the anodic third film (3) on a sloping side-wall of the track/electrode (11a, 11b). A crossing track (C2,18) or TFT channel region 15 may be deposited over the insulated track/electrode (11a, 11b).

5 Claims, 3 Drawing Sheets

THIN FILM TRANSISTOR FILMS MADE WITH ANODIZED FILM AND REVERSE-ANODIZED ETCHING TECHNIQUE

This invention relates to methods of manufacturing an electronic device comprising a thin-film circuit, in which anodising steps are carried out. The device may be a flat panel display (for example a liquid crystal display), or a large-area image sensor, or several other types of large-area electronic device (for example a thin-film data store or memory device, or a thermal imaging device). The invention also relates to the devices manufactured by such methods.

There is currently much interest in developing thin-film circuits with thin-film transistors (hereinafter termed "TFTs") and/or other semiconductor circuit elements on glass and on other inexpensive insulating substrates, for large area electronics applications. Such TFTs fabricated with amorphous or polycrystalline semiconductor films may form the switching elements in a cell matrix, for example in a flat panel display as described in U.S. Pat. No. 5,130,829 (Our ref: PHB 33646), the whole contents of which are hereby incorporated herein as reference material. Such large area electronic devices comprise various thin-film patterns of different materials, for example metal and other conductive materials, insulating materials, silicon and other semiconductor materials.

It is known to form some of the thin-film conductor patterns of anodisable material which are covered with an insulating film by an anodisation treatment. U.S. Pat. No. 5,202,274 (the whole contents of which are hereby incorporated herein as reference material) discloses such a method in which measures are taken to improve step coverage and prevent short circuits. The method described in U.S. Pat. No. 5,202,274 comprises the steps of:

(a) depositing a first film of anodisable material on a substrate, (b) anodising at least a part of the first film through a part of its thickness to form an anodic second film on the first film, (c) providing a mask pattern at least on the anodic second film, the mask pattern having a window exposing a selected area of the anodic second film, (d) etching away the exposed selected area of the anodic second film through at least a part of its thickness, and (e) anodising at least a further part of the first film through the window in the mask pattern to form an anodic third film contiguous with a remaining part of the anodic second film on the first film.

In the method disclosed in U.S. Pat. No. 5,202,274 the anodisable material is an aluminium alloy. A variety of electrolyte solutions may be used for the anodising steps (b) and (e), for example aqueous solutions of ammonium tartrate, a tartaric acid, or a citric acid. The mask pattern of steps (c) to (e) is of photoresist, and dry-etching is used to remove the exposed selected area of the anodic $Al_2O_3$ in step (d). $BCl_3$, $SiCl_4$, $CCl_4$ or $PCl_3$ may be used for this dry-etching step (d). These process steps (a) to (e) are used to form a conductor track of the aluminium alloy, having the anodic second film of $Al_2O_3$ on top of the track and the anodic third film of $Al_2O_3$ on a sloping side-wall of the track.

It is an aim of the present invention to simplify such a manufacturing method.

According to the present invention, there is provided a method of manufacturing an electronic device comprising a thin-film circuit, the method comprising the steps of:

(a) depositing a first film of anodisable material on a substrate, (b) anodising at least a part of the first film through a part of its thickness to form an anodic second film on the first film, (c) providing a mask pattern at least on the anodic second film, the mask pattern having a window exposing a selected area of the anodic second film, (d) etching away the exposed selected area of the anodic second film through at least a part of its thickness, and (e) anodising at least a further part of the first film through the window in the mask pattern to form an anodic third film contiguous with a remaining part of the anodic second film on the first film, which method is characterised in that the etching step (d) is carried out in an electrolyte solution by reverse-anodising the exposed selected area of the anodic second film through at least a part of its thickness, the first film being biased negatively as a cathode to carry out the reverse-anodising, after which the anodising step (e) is carried out by biasing the first film positively as an anode in the same electrolyte solution to form the anodic third film.

In such a method in accordance with the present invention the etching step (d) is carried out in the same electrolyte solution as the subsequent anodising step (e), by reversing the bias on the first film so as to act as a cathode in step (d) and as an anode in step (e). Thus, in a method in accordance with the present invention, there is no need to transfer the thin-film device structure between a dry-etching apparatus for step (d) and an electrolytic bath for step (e). Furthermore, because the etching step (d) and further anodising step (e) are carried out in the same environment (by merely switching the electrical bias) there is less risk of contamination of the anodic films and the anodisable films, for example, from the ambient or by ionic species or bombardment in a prior art etching step (d). This reduced risk of contamination is especially advantageous when the anodisable film is of a semiconductor material providing an electronically active region (e.g TFT channel region) of the device.

Methods in accordance with the present invention may be used to pattern and insulate a variety of circuit elements and parts. Thus, for example, a remaining part of the first film may provide a conductor track or a gate electrode of a TFT, having a part of the anodic third film on a sloping side-wall and a part of the anodic second film on top of the conductor track and/or gate electrode. The anodisable material of the first film may be, for example, at least predominantly aluminium or tantalum. These materials are commonly used at present in thin-film circuits of large area electronic devices. In another form, the anodisable material of the first film may be a semiconductor (for example at least predominantly silicon). In this case, after the anodising steps (b) and (d), a remaining part of this first film may provide a semiconductor thin-film circuit element island over which there is an insulating film comprising a part of the anodic second film on top of the island and a part of the anodic third film on a sloping side-wall of the island.

These and other features in accordance with the present invention, and their advantages, are illustrated specifically in embodiments of the invention now to be described, by way of example, with reference to the accompanying diagrammatic drawings, in which.

Figure 1:
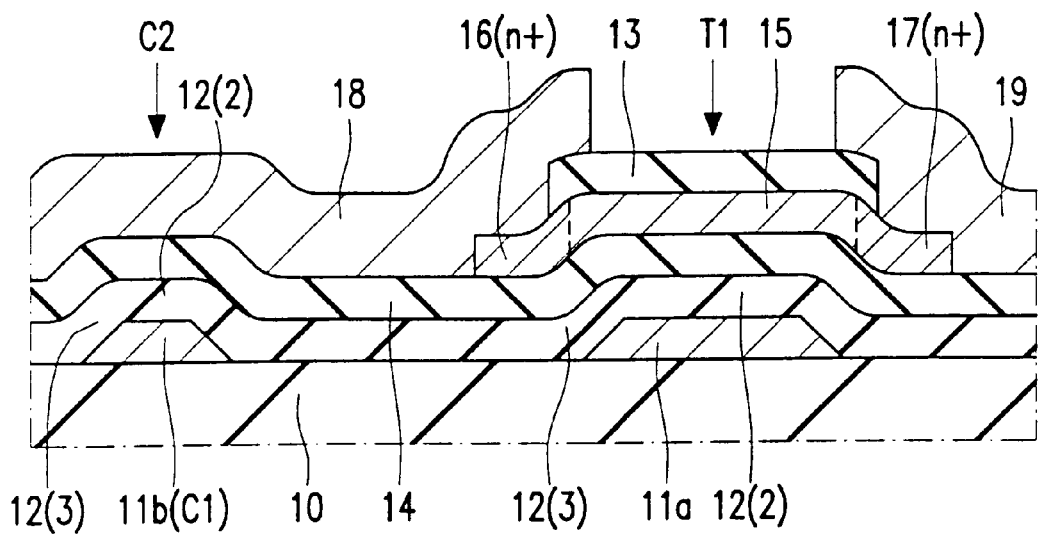
FIG. 1 is a cross-sectional view through part of a thin-film circuit in an electronic device manufactured by a method in accordance with the present invention.

Relative dimensions and proportions of parts of the cross-sectional views in all the Figures have been shown exaggerated or reduced in size for the sake of clarity and convenience in the drawings. The same or similar reference signs are generally used to refer to corresponding or similar features in the different embodiments.

Figure 7:
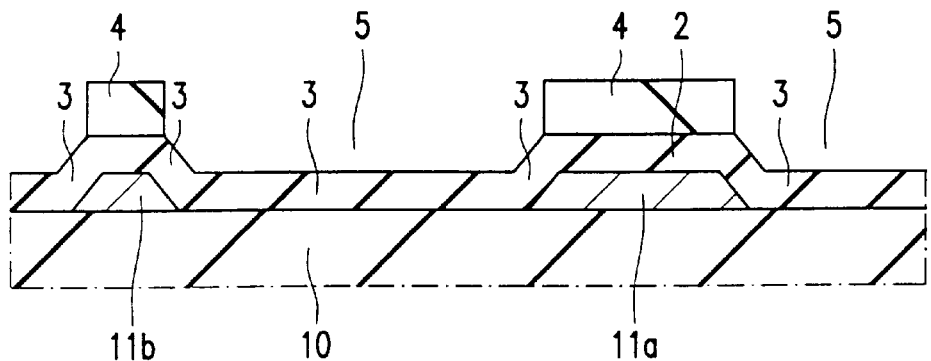
Figure 8:
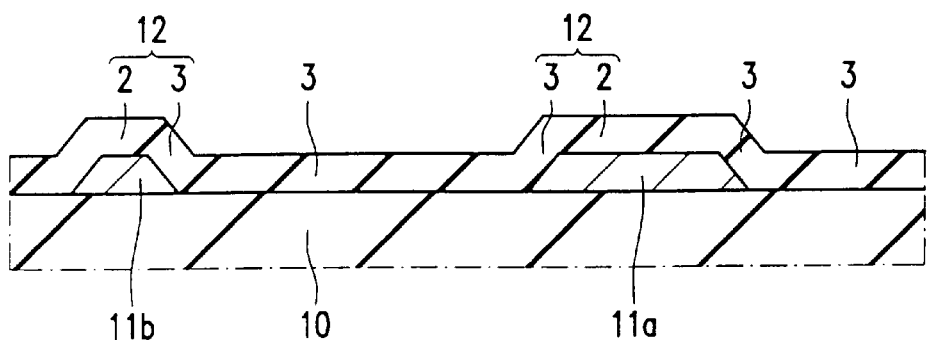

FIGS. 1 to 8 illustrate stages in the manufacture of a large-area electronic device comprising a thin-film circuit. By way of example, the part of the circuit illustrated in FIG. 1 comprises two crossing conductor tracks C1 and C2 and a TFT T1 having a bottom gate electrode 11a. The method of FIGS. 1 to 8 comprises the steps of:

(a) depositing a first film 1 of anodisable material on a substrate 10 (FIG. 3), (b) anodising at least an area of the first film 1 through a part of its thickness to form an anodic second film 2 on the first film 1 (FIG. 4), (c) providing a mask pattern 4 at least on the anodic second film 2 (FIG. 5), the mask pattern having a window 5 exposing a selected area of the anodic second film 2, (d) etching away the exposed selected area of the anodic second film 2 through at least a part of its thickness (FIG. 6), and (e) anodising at least a further part of the first film 1 through the window 5 in the mask pattern 4 to form an anodic third film 3 contiguous with a remaining part of the anodic second film 2 on the first film 1 (FIGS. 7 and 8).

In accordance with the present invention the etching step (d) is carried out in an electrolyte solution 20 by reverse-anodising the exposed selected area of the anodic second film 2 through at least a part of its thickness, the first film 1 being biased negatively as a cathode to carry out the reverse-anodising, after which the anodising step (e) is carried out by biasing the first film 1 positively as an anode in the same electrolyte solution 20 to form the anodic third film 3. In the specific embodiment illustrated in FIG. 1, remaining parts 11a and 11b of the first film 1 provide respectively the bottom gate electrode of TFT T1 and the conductor track C1. An anodic insulating film 12 is present over the parts 11a and 11b. This film 12 comprises a part of the anodic second film 2 on top of the gate electrode 11a and conductor track 11b and a part of the anodic third film 3 on a sloping side-wall of the gate electrode 11a and the conductor track 11b. The anodisable material of the first film 1 may be at least predominantly tantalum or aluminium. In a particular example, the thin-film circuit part of FIG. 1 may form part of a liquid crystal display device such as is disclosed in U.S. Pat. No. 5,130,829. The device substrate 10 is electrically insulating at least adjacent to its top surface. The substrate 10 may comprise a glass or other low-cost insulating material. In a particular embodiment, it may comprise an upper layer of silicon dioxide on a glass panel which forms one of the panels of the display device.

A specific example in which the first film 1 is predominantly of aluminium will now be described. In this example, the film 1 may be an alloy of aluminium with one or more elements from the group of Si, Pd, Ni, Ge, W, Cr; and Ti. After depositing the film 1 in known manner on the substrate 10, an anodising step is carried out to form an anodic $Al_2O_3$ film 2 using the equipment of FIG. 2. The FIG. 2 equipment may be of known form, apart from the inclusion of a polarity reversing switch 25.

Figure 2:
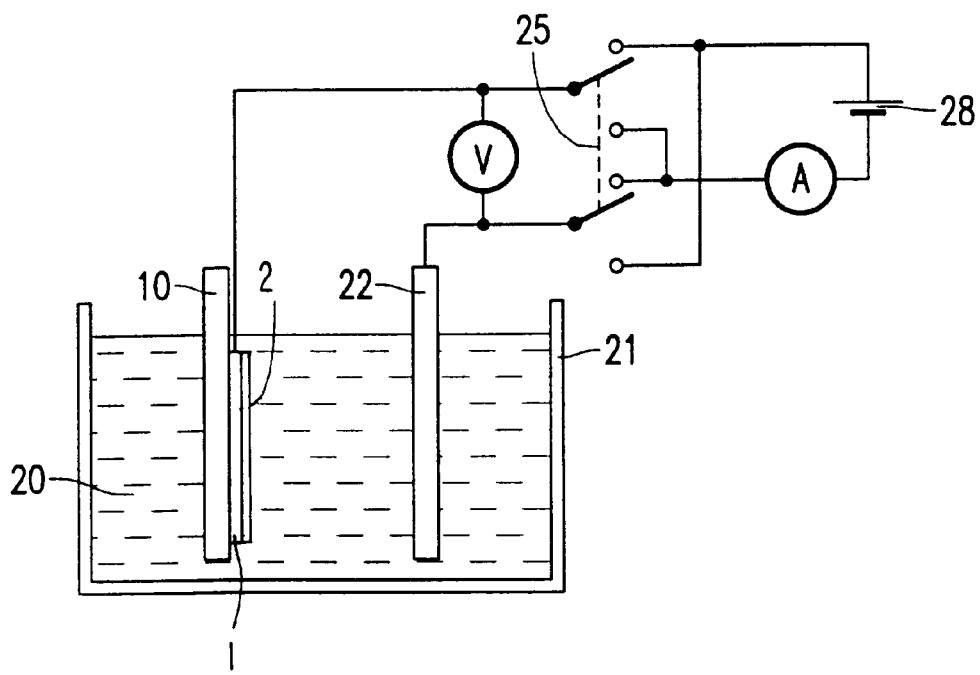
FIG. 2 is a schematic representation of an electrolytic bath and associated circuit for use in anodising and reverse-anodising steps in accordance with the present invention.

Thus, the FIG. 2 equipment comprises an electrolytic bath containing a suitable electrolyte solution 20 for anodising the predominantly aluminium film 1. The electrolyte 20 may be a known solution, for example as described in U.S. Pat. No. 5,202,274, for example an aqueous solution having a weight percentage of 0.25% tartaric acid. The Applicants find that a solution of tri-ammonium-tetraborate (for example 0.25 percentage by weight) in boric acid is a particularly advantageous solution 20 for anodising predominantly aluminium films 1. The boric acid serves to neutralise the solution which has an overall pH value of approximately 7.0. Switch 25 is any suitable type of polarity-reversing switching arrangement included in the connections to a DC power supply 28. In its simplest form it is a mechanical switch movable between two on positions of opposite polarity. The switch 25 may conveniently form part of the DC power supply unit.

The anodising step may be carried out in known manner. The film 1 is connected to the positive terminal of the DC power supply 28. The external connection to the film 1 may be made in known manner, for example by a contact direct to a peripheral area of the film 1 or by a contact to a peripheral area of a conductive, very thin film of non-anodisable material (for example chromium, or nickel, or indium tin oxide/ITO) between the aluminium film 1 and the insulating substrate 10. A disadvantage of using a film of non-anodisable material for the contact is that in most devices it will be necessary after completion of all the anodising (and reverse-anodising) steps to etch this film of non-anodisable material into separate electrically isolated areas so as to avoid undesirable electrical connections of the circuit elements of the device. The electrolyte 20 has an electrode connection 22 which is connected to the negative terminal of the supply 28. The electrode connection 22 is usually of a metal such as platinum, not part of the wall 21 of the electrolytic bath. In principle, the wall 21 may be of a suitable metal to form this electrode connection to the negative terminal of supply 28, in which case a separate member 22 is not required.

Figure 4:
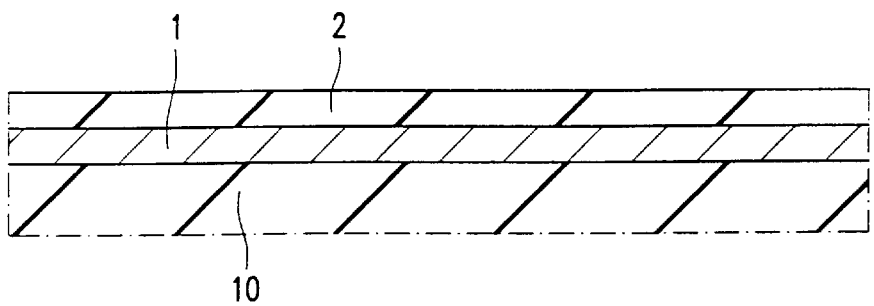

During the anodising step, a constant current may be applied across the electrolytic cell until a certain voltage is reached (for example in the range of 80 V to 100 V), and the voltage may then be kept constant until the current falls by an order of magnitude. In this case, the thickness of the anodic oxide film 2 is in direct proportion to the voltage applied across the cell. Typical values are in the range of 1.3 $nm.V^{-1}$ to 1.7 $nm.V^{-1}$. The current density through the anodic oxide film 2 is important for the properties of the film 2. A compressive film with superior insulating properties may be formed by using a low current density, for example less than 0.5 $mA.cm^{-2}$. After removal from the electrolytic bath of FIG. 2, the device substrate 10 with the film structure 1,2 is transferred to a de-ionised water bath to remove traces of the electrolyte solution 20 from its surface and is then dried, for example, in air. The resulting structure is illustrated in FIG. 4.

Figure 5:
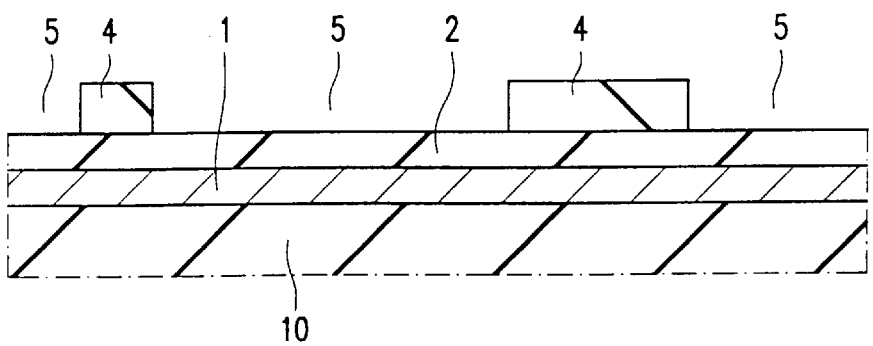
Figure 6:
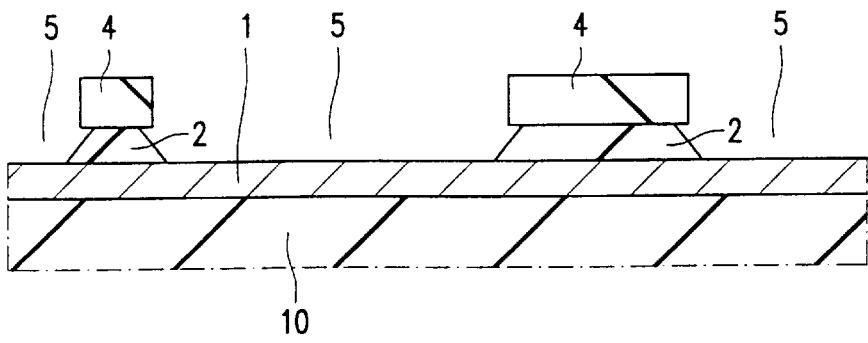

The mask pattern 4 of FIG. 5 is then provided. The mask pattern 4 may be of photoresist, which is particularly convenient to form by using known photolithographic processes. The pattern 4 corresponds to the desired conductor pattern 11a, 11b, allowing for the sideways spread of the anodic $Al_2O_3$ and the sloping side-walls of these parts 11a and 11b. The device substrate 10 with the thin-film structure 1,2 and mask pattern 4 is re-immersed in the electrolyte 20 of the electrolytic bath of FIG. 2. However, the switch 25 is now switched to its opposite polarity so that the film 1 is connected to the negative terminal of supply 28 and the electrode connection 22 or 21 of the electrolyte 20 is connected to the positive terminal of the supply 28.

With this opposite polarity between the film 1 and the electrolyte 20, reverse-anodising occurs, in which the exposed area of the anodic film 2 at the window 5 in the masking pattern 4 is dissolved in the electrolyte solution 20. In the particular example illustrated in FIG. 6, the film 2 is removed throughout its thickness at these windows 5. A similar voltage level and current density may be used for this reverse-anodising step (d) as was used for the anodising step (b).

Without removing the device substrate 10 (with its thin-film structure 1,2 and mask pattern 4) from the electrolyte solution 20, the switch 25 is now switched to its original polarity state. Thus, the film 1 is now connected again to the positive terminal of the power supply 28, so functioning as an anode in the electrolyte solution 20. In this situation, the reverse-anodising ceases, and the exposed areas of the predominantly aluminium film 1 begin to anodise. In the particular example of FIG. 7 this anodising step is carried out throughout the thickness of the film 1 in the windows 5, and so the film 1 is divided into separate insulated areas 11a, 11b, . . . by the growth of the anodic third film 3 throughout its thickness. The resulting structure is illustrated in FIG. 7.

The device substrate 10 with the thin-film structure 1 to 3 is then removed from the electrolyte solution 20 and is washed, after which the photoresist mask pattern 4 is removed in known manner. FIG. 8 illustrates the resulting thin-film structure comprising an overlying anodic insulating film 12 on the conductor parts 11a and 11b on the device substrate 10. In order to densify the anodic $Al_2O_3$ film 2,3,12 it is advantageous to anneal the thin-film structure in an inert ambient (for example by heating for about 1 hour at 200° C. in nitrogen) so as to remove water molecules from the anodic film. This annealing treatment may automatically occur during the deposition of subsequent films of the device e.g a second dielectric film 14 and a semiconductor film 15. Alternatively, the annealing treatment may be carried out as a separate process step in the device manufacture. The manufacture of the device structure of FIG. 1 may be completed in known manner.

Thus, for example, an optional second insulating film 14 may be deposited over the insulating film 12. The film 14 may be of any suitable dielectric material, for example silicon nitride. The films 12 and 14 together provide the gate dielectric of the TFT T1. A semiconductor channel region of the TFT T1 is formed by depositing a semiconductor film (for example of hydrogenated amorphous silicon, which may be subsequently laser annealed to form polycrystalline silicon, if so desired). By known photolithographic and etching processes, the semiconductor film can be patterned into separate islands for each TFT of the device. FIG. 1 shows one such island 15 of one TFT T1. Highly doped source and drain regions 16 and 17 of the TFT are then formed in known manner, for example by ion implantation into the silicon film island 15 (as illustrated in FIG. 1) or by a doped film deposited on the island 15 (see FIG. 4 of U.S. Pat. No. 5,130,829 and FIG. 1 of U.S. Pat. No. 5,202,274). A metal film (for example of aluminium) is then deposited and photolithographically defined to form the desired electrode connections and circuit element interconnections of the device, for example, the conductor tracks 18 (C2) and 19 of FIG. 1. Before depositing this metal film 18,19, a further insulating film may be deposited and patterned to leave further insulating layer parts 13, for example of silicon nitride on the TFT islands 15.

Figure 3:
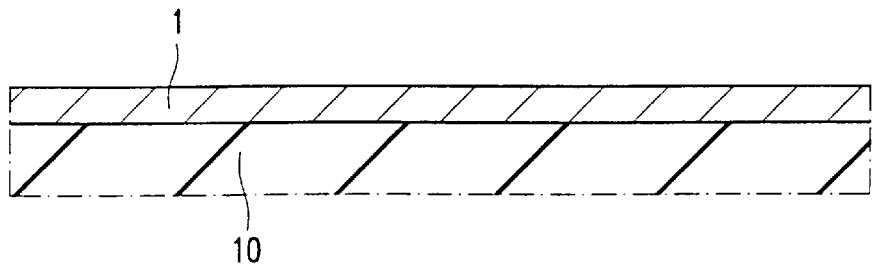
FIGS. 3 to 8 are cross-sectional views of the device structure of FIG. 1 at successive stages in manufacture by a method in accordance with the present invention.

In a specific example of the embodiment of FIGS. 1 to 8, the original film 1 of Al may be typically about 300 nm thick as deposited in FIG. 3, and the anodic film 2 of $Al_2O_3$ may be formed to a thickness of, for example, about 150 nm in FIGS. 2 and 4. The remaining thickness of the film 1 below the film 2 may be about 200 nm. The anodic film 3 of $Al_2O_3$ may be of about 300 nm thickness. The respective thicknesses of the silicon nitride films 13 and 14 may be, for example, about 100 nm and 300 to 400 nm. The thickness of the conductor tracks 18 and 19 may be in the range of 300 nm to 1000 nm. The anodic films 2 and 3 may typically have a dielectric constant of about 8.5, and their breakdown field strength may be about 8 $MV.cm^{-1}$.

Although a specific example involving the anodisation of aluminium has been described with reference to FIGS. 1 to 8, it will be evident that many modifications and variations are possible within the scope of the present invention. Instead of aluminium the conductor parts 11a and 11b may be formed of another anodisable metal, for example tantalum. It is also possible to use the present invention for anodising and reverse-anodising semiconductor material, for example highly-doped silicon forming conductor tracks. Although in the specific example illustrated in FIGS. 5 and 6 the anodic second film 2 is removed throughout its entire thickness at the windows 5 by the reverse-anodising step (d), the reverse-anodising in other examples may be carried out through only a part (e.g two-thirds) of the thickness of the film 2 at the window 5. By removing the film 2 through only a part of its thickness at the window 5 in the reverse-anodising step (d), a further degree of process flexibility is achieved for the control of the thickness of the insulating film 12 grown in its different areas, such as on top of the parts 11a and 11b, on the side-walls of the parts 11a and 11b, and on the substrate 10 between the parts 11a and 11b. Furthermore, if desirable for a specific conductor pattern, areas of the anodisable film 1 at the stages of FIGS. 3 and 6 may be masked (e.g by a photoresist pattern) and/or etched away through all or part of their thickness before anodising to form the respective films 2 and 3 of FIGS. 4 and 7.

Figure 9:
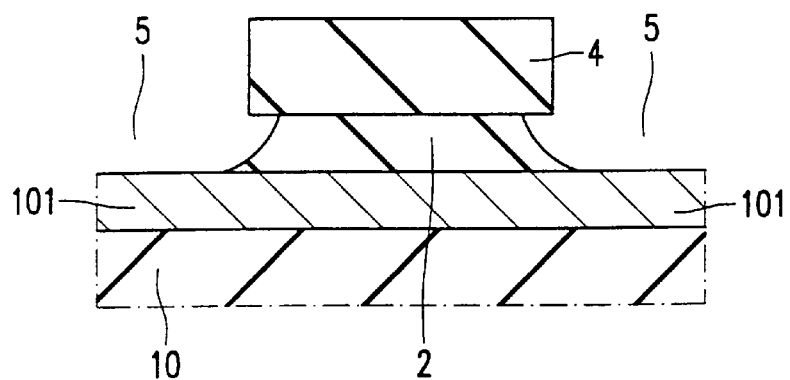
FIGS. 9 and 10 are cross-sectional views of another thin-film device structure at successive stages in its manufacture by another method which is also in accordance with the present invention.
Figure 10:
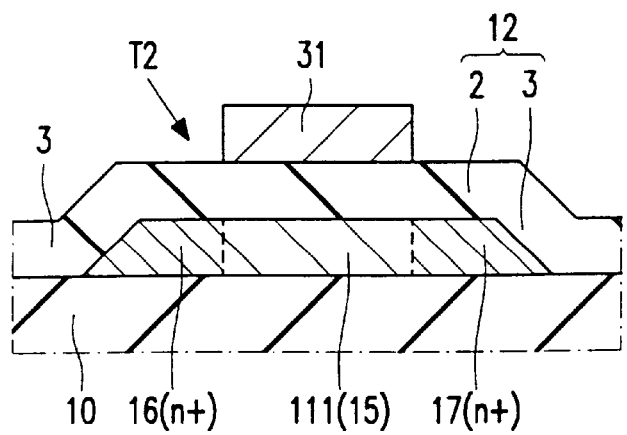

FIGS. 9 and 10 illustrate a second embodiment in which the anodisable material of the first film 101 is at least predominantly silicon. The silicon film 101 may be deposited by known chemical vapour deposition processes as amorphous silicon or micro-crystalline silicon or polycrystalline silicon. It may comprise a hydrogen content to passivate dangling bonds in the silicon material. A remaining part 111 of the film 101 may be retained in the manufactured device as a silicon thin-film circuit element island, for example to provide a channel region of a TFT T2.

The manufacturing method of FIGS. 9 and 10 comprises the steps of:

(a) depositing the silicon first film 101 on the substrate 10, (b) anodising at least an area of the silicon film 101 through a part of its thickness to form an anodic second film 2 (of silicon oxide) on the silicon film 101, (c) providing a mask pattern 4 at least on the anodic film 2, the mask pattern 4 having a window 5 exposing a selected area of the anodic film 2, (d) etching away the exposed second area of the anodic film 2 through at least a part of its thickness (FIG. 9), and (e) anodising at least a further part of the silicon film 101 through the window 5 in the mask pattern 4 to form an anodic third film 3 (of silicon oxide) contiguous with a remaining part of the anodic second film 2 on the silicon film 101.

In accordance with the present invention the etching step (d) is carried out in an electrolyte solution 120 by reverse-anodising the exposed selected area of the anodic film 2 through at least a part of its thickness. The silicon film 101 is biased negatively as a cathode to carry out the reverse-anodising. Thereafter, the anodising step (e) is carried out by biasing the silicon film 101 positively as an anode in the same electrolyte solution 120 to form the anodic film 3. By this means an insulating film 12 of silicon oxide is formed over the silicon thin-film circuit island 111 and comprises a part of the anodic second film 2 on top of the silicon island and a part of the anodic third film 3 on the sloping side wall of the silicon island. The insulating layer 12 may form at least at part of the gate dielectric of a TFT T2. Thus, this TFT T2 may have a top gate electrode formed on the insulating film 12 or on a further insulating layer 14 over the insulating layer 12 over the silicon island 111. Highly doped source and drain regions 16 and 17 may be formed in the silicon island 111 in known manner by dopant ion implantation using the gate electrode 31 as an implantation mask. Windows may be etched in the insulating film 12 (or 12 and 14) for electrode connections 18 and 19 etc to contact the source and drain regions 16 and 17 etc.

This method of FIGS. 8 and 9 in accordance with the present invention is advantageous in avoiding ionic contamination and damage of the silicon island 111 and (its anodic oxide cover film 12) such as may occur using prior art dry etching processes for the etching step (d). Instead the etching step (d) is carried out in the same environment as the anodising step (e).

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during prosecution of the present application or of any further application derived therefrom.

We claim:

1. A method of manufacturing an electronic device comprising a thin-film circuit, the method comprising the steps of:

(a) depositing a first film of anodisable material on a substrate, (b) anodising at least a part of the first film through a part of its thickness to form an anodic second film on the first film, (c) providing a mask pattern at least on the anodic second film, the mask pattern having a window exposing a selected area of the anodic second film, (d) etching away the exposed selected area of the anodic second film through at least a part of its thickness, and (e) anodising at least a further part of the first film through the window in the mask pattern to form an anodic third film contiguous with a remaining part of the anodic second film on the first film, characterised in that the etching step (d) is carried out in an electrolyte solution by reverse-anodising the exposed selected area of the anodic second film through at least a part of its thickness, the first film being biased negatively as a cathode to carry out the reverse-anodising, after which the anodising step (e) is carried out by biasing the first film positively as an anode in the same electrolyte solution to form the anodic third film.

2. A method as claimed in claim 1, further characterised in that, after the anodising steps (b) and (d), a remaining part of the first film provides a conductor track over which there is an insulating film comprising a part of the anodic second film on top of the conductor track and a part of the anodic third film on a sloping side-wall of the conductor track.

3. A method as claimed in claim 1, further characterised in that, after the anodising steps (b) and (d), a remaining part of the first film provides a gate electrode of a thin-film transistor having an insulating film over the gate electrode, which insulating film comprises a part of the anodic second film on top of the gate electrode and a part of the anodic third film on a sloping side-wall of the gate electrode, and further characterised by (f) depositing a semiconductor film after the step (e) to provide a semiconductor channel region of the thin-film transistor.

4. A method as claimed claim 1, further characterised in that the anodisable material of the first film is at least predominantly aluminium or tantalum.

5. A method as claimed in claim 1, further characterised in that the anodisable material of the first film is at least predominantly silicon, and in that, after the anodising steps (b) and (d), a remaining part of the first film provides a silicon thin-film circuit element island over which there is an insulating film comprising a part of the anodic second film on top of the silicon island and a part of the anodic third film on a sloping side-wall of the silicon island.

* * * * *